United States Patent [19]
Curtin et al.

[11] Patent Number: 5,319,371
[45] Date of Patent: Jun. 7, 1994

[54] D/A CONVERTER WITH MEANS TO PREVENT OUTPUT SIGNAL INSTABILITY

[75] Inventors: Michael G. Curtin; Michael Byrne, both of Limerick, Ireland

[73] Assignee: Analog Devices, Inc., Norwood, Mass.

[21] Appl. No.: 977,681

[22] Filed: Dec. 28, 1992

[51] Int. Cl.⁵ .............................................. H03M 1/66
[52] U.S. Cl. .................................................. 341/144
[58] Field of Search .................. 341/144, 118, 120; 323/265, 274, 271

[56] References Cited

U.S. PATENT DOCUMENTS 4,276,593  6/1981  Hansen ............................... 364/119
4,945,301  7/1990  Koga et al. ......................... 323/902

Primary Examiner—Brian K. Young
Attorney, Agent, or Firm—Parmelee, Bollinger & Bramblett

[57] ABSTRACT

A D/A converter of the type provided with an amplifier to produce the analog output signal and formed as an IC chip. The chip includes a power voltage monitor to sense when the applied DC voltage is above a preset lower level and below a preset upper level. When that condition is sensed, the monitor activates a control circuit which in turn opens a transmission gate between the amplifier output circuit and the converter output terminal, and closes a transmission gate between the output terminal and ground. When the DC voltage goes above the preset upper level, and a valid digital word is loaded into the converter register and presented for conversion, the condition of the transmission gates is reversed to provide for normal operation of the converter.

16 Claims, 1 Drawing Sheet

D/A CONVERTER WITH MEANS TO PREVENT OUTPUT SIGNAL INSTABILITY

BACKGROUND OF THE INVENTION

1. Field of the Invention

This invention relates to D/A converters. More particularly, this invention relates to such converters used in applications where instability in the converter output signal can cause severe difficulties.

2. Description of the Prior Art

D/A converters are used in many different kinds of systems, and in some of those systems any instability in the converter output signal, such as so-called "glitches", can result in serious problems. For example, D/A converters frequently are used in modern process control systems, e.g., to supply control signals to process valves, drive motors, actuators, and the like. Instability in the signals directed to such devices can result in serious harmful effects in the performance of the process. A common cause of such signal instability in prior systems has been the loss of electrical power to the D/A converter, as well as erratic performance of the converter circuitry during power-up of the system.

SUMMARY OF THE INVENTION

In a preferred embodiment of the present invention, to be described below in detail, a D/A converter is provided with a power voltage monitor which continuously senses the voltage of the DC electrical power supplied to the converter. Such supply voltage might for example nominally be 15 volts, and is used to energize major portions of the circuitry including the amplifier which develops the converter output signal. When the power first comes on and the voltage begins its ramp-up from zero, the voltage monitor senses when it has reached a preset low level, such as one volt, sufficient to activate certain parts of the circuitry, but insufficient to properly energize the converter. Upon sensing that low-level voltage, the monitor produces a control signal which (a) closes one gate to clamp the output terminal of the converter to ground so that no signal will appear at this point, and (b) opens a second gate to isolate the amplifier output circuitry from the grounded output terminal.

As the power supply voltage continues its ramp up and reaches a preset high level, such as 10 volts, the voltage monitor senses this. When a subsequent digital word is written to and loaded in the D/A converter, the two gates are controlled to (a) unground the output terminal and (b) connect the amplifier output circuitry to that terminal. The supply voltage thereafter continues its ramp-up to the specified nominal operating level such as 15 volts.

Upon power-down, or inadvertent loss of power, the sequence is reversed. That is, when the voltage drops to the preset high level such as 10 volts, the converter output terminal will be clamped to ground and the amplifier output circuit will be isolated from the output terminal. When the voltage reaches the preset low level, such as one volt, the status of the gates becomes indeterminate.

BRIEF DESCRIPTION OF THE DRAWING

The single FIGURE presents a block diagram illustrating one type of D/A converter with control circuitry arranged to prevent converter output signal instability during power-up or power-down of the system power supply.

DETAILED DESCRIPTION OF A PREFERRED EMBODIMENT

Figure 1:
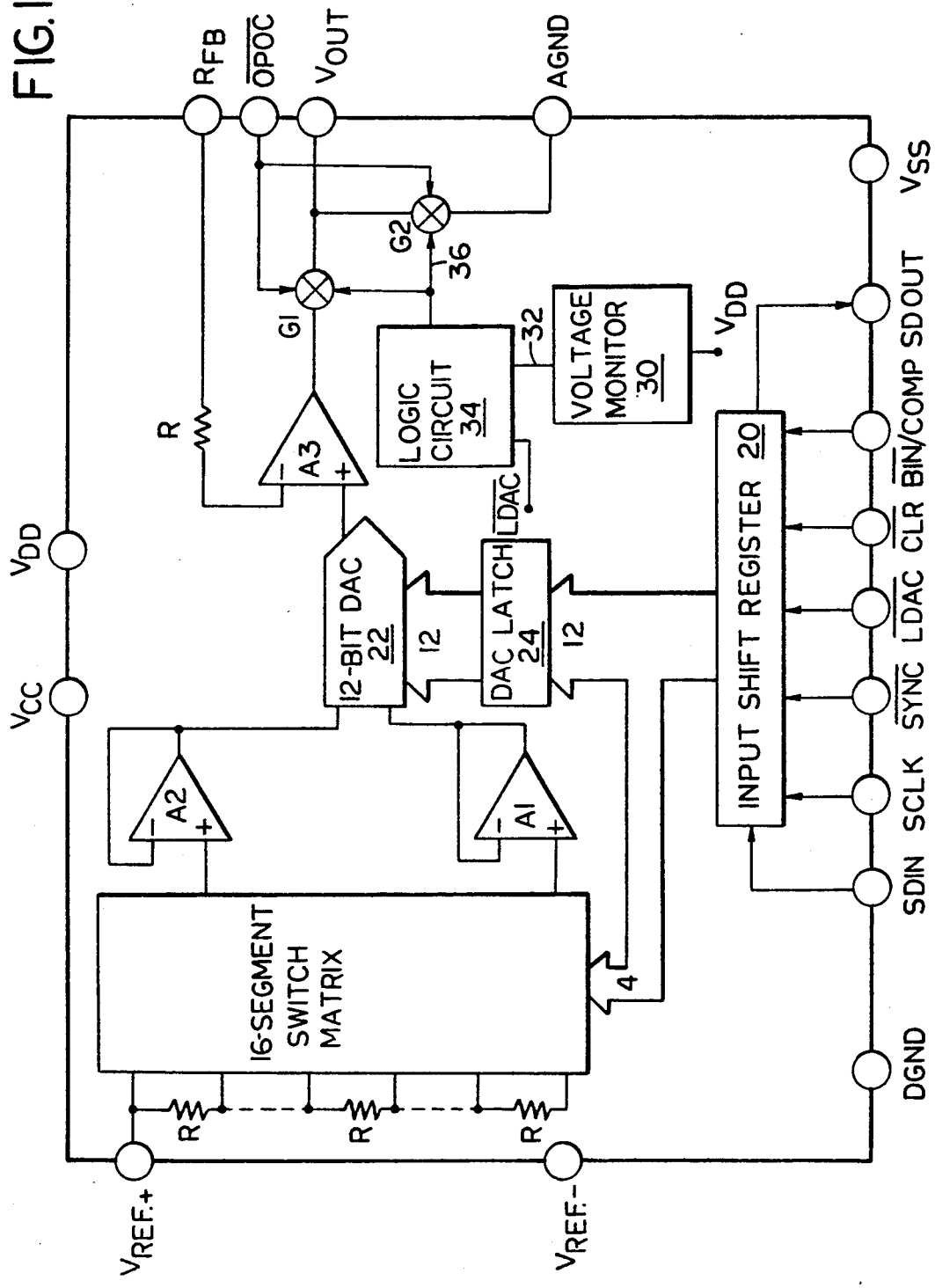

The single drawing FIGURE illustrates a D/A converter of known type formed as an IC chip and arranged to receive 16 bits of signal input data in a shift register 20. This chip is provided with appropriate signal and control terminals well understood in this art, such as SDIN (serial data IN), SCLK (serial clock), LDAC (load DAC), etc., which typically are supplied with signals from a system processor operating under program control. In the particular type of converter used to illustrate the invention, the four most-significant bits are directed from the shift register to a switch matrix the output of which is supplied to a 12-bit DAC 22 for decoding the remaining 12 bits of data from a DAC latch 24. The output of this DAC is directed to an amplifier A3 which produces an output signal for the D/A converter output terminal $V_{OUT}$. A feedback resistor R is provided, and typically may be connected to the output terminal to set the amplifier gain.

The chip includes terminals to receive operating power, illustrated here as $V_{DD}$ and $V_{CC}$. $V_{DD}$ is the principal supply voltage which powers much of the converter circuitry including the amplifier A3, and may have a nominal value of 15 volts. $V_{CC}$ is included for low-power logic circuitry, such as latches and for the shift register 20, and may have a nominal value of 5 volts.

When the system is first turned on, the supply voltage will ramp up to its nominal value. This ramp-up will occur quite fast, e.g., over a period of a few hundred or so milliseconds. Although quite short, that period nevertheless is sufficient to allow random voltage fluctuations to be produced at the output of the amplifier A3 as $V_{DD}$ passes through levels of voltage capable of activating circuitry within the converter, but insufficient to operate the converter properly.

Once operating properly, the system may lose power accidentally, or it may be shut down purposefully. In either event, random voltage fluctuations could occur at the output of amplifier A3 as $V_{DD}$ passes through lower voltage levels capable of producing such fluctuations, but not capable of proper converter and amplifier operation.

Such output signal fluctuations, occurring either during power-up or power-down of the system, could cause serious repercussions upon reaching sensitive process control apparatus such as valve actuators, drive motors, and so on.

In accordance with the present invention, adverse consequences as described above are avoided by means of special control circuitry built in to the converter IC chip. In more detail, the IC chip is provided with a voltage monitor 30 to which is connected a line carrying the DC power supply voltage $V_{DD}$. When $V_{DD}$ is on, this line supplies current to the monitor for its operation, and the monitor senses the voltage level and responds in ways to be described below.

When the power supply is first turned on at power-up of the system, the voltage of $V_{DD}$ starts to ramp up from zero, heading towards its nominal value which may typically be 15 volts. At very small voltages, such as below one volt, the circuitry of the converter does not produce an output signal from the amplifier A3. However, at or above a slightly higher low-level voltage, such as between one and two volts, the amplifier can produce random voltage fluctuations which if delivered to process control devices could cause serious damage. To avoid that result, the voltage monitor 30 is arranged to detect such a pre-set low-level voltage and to produce in its output line 32 a control signal which is directed to a control circuit 34. This control circuit produces a corresponding control signal on its output line leading to two gates G1, G2.

This control signal on line 36 opens gate G1, and thereby interrupts the connection between the amplifier output circuitry and the converter output terminal $V_{OUT}$. Thus, voltage fluctuations at the amplifier output circuitry cannot pass through to the output terminal to improperly activate down-stream devices.

The control signal on line 36 also closes gate G2 which connects the output terminal $V_{OUT}$ directly to analog ground (AGND). This short-to-ground further assures that no signals can be transmitted from the converter output terminal to sensitive down-stream process devices.

As $V_{DD}$ continues its ramp up, it will reach a higher-voltage level such as 10 volts, which is sufficient to provide proper and stable converter operation. The monitor 30 is arranged to sense when such a preset upper-level voltage is reached, and will in response alter its output on line 38 to the control circuit 34. This control circuit also receives the signal $\overline{LDAC}$ which goes low to indicate when a valid 16-bit word has been written to the shift register 20 and loaded to the converter. Upon that condition being reached, the control circuit alters its control signal to close gate G1 and open gate G2. Thus, the D/A converter now can operate to provide stable output signals from its output terminal $V_{OUT}$ for activating process devices such as valves or actuators.

If the power supply voltage $V_{DD}$ drops back to 10 volts (or so), either due to power failure or purposefully, the sequence of control actions described above occurs in reverse. That is, the voltage monitor 30 output changes to cause the gate G1 to open and the gate G2 to close, thereby assuring that unstable signal fluctuations cannot be transmitted from the output terminal $V_{OUT}$. If the voltage drops to below such lower level, such as one volt, the monitor 30 no longer can control the gates G1 and G2, and their status becomes indeterminate. However, such a low level voltage for $V_{DD}$ is not sufficient to cause fluctuations of significant power at the converter outputs.

Provision also is included for operating the gates G1 and G2 from an external source, through the terminal labelled OPOC (Output Open Circuit). For example, this terminal can be driven by a power supply supervisor chip effectively serving the same function as the voltage monitor 20. In power-off or during a brown-out, the OPOC input will be driven low to open G1 and close G2.

Although a preferred embodiment of the invention has been disclosed herein in detail, this has been for the purpose of illustrating the invention, and should not be construed as necessarily limiting the scope of the invention since it is apparent that many changes can be made by those skilled in the art while still practicing the invention claimed herein.

What is claimed is:

1. In a D/A converter formed on an IC chip wherein the converter includes an amplifier to be energized by a power-supply voltage with a nominal operating voltage level and having an output circuit producing an amplified signal for developing at an output terminal of the converter an analog output signal to be directed to a device responsive to such output signal; that improvement for preventing unstable output signal fluctuations during power-up or power-down of said supply voltage comprising:
   a voltage-monitoring device arranged to receive said power-supply voltage to sense its level;
   signal-isolation means coupled to said output terminal;
   said voltage-monitoring device including means operable during power up and power down of said power supply voltage to activate said signal-isolation means upon detecting that the supply voltage is above a preset low level substantially lower than said nominal level and below a preset upper level above said low level but below said nominal level, thereby to prevent fluctuations in said output signal from reaching apparatus which might be adversely affected by such fluctuations.

2. A D/A converter as claimed in claim 1, wherein said signal-isolation means comprises a transmission gate between said amplifier output circuit and said converter output terminal, said gate being arranged to be opened by said voltage-monitoring device when said power supply voltage is above said preset low level and below said preset upper level.

3. A D/A converter as claimed in claim 1, wherein said signal-isolation means comprises a transmission gate between said converter output terminal and circuit common, said transmission gate being arranged to be closed by said voltage-monitoring device when the power supply voltage is above said preset low level and below said preset upper level.

4. A D/A converter as claimed in claim 1, wherein said signal-isolation means comprises first and second transmission gates, said first gate being coupled between said amplifier output circuit and said converter output terminal, said second transmission gate being coupled between said converter output terminal and circuit ground.

5. Apparatus as claimed in claim 1, including means to disable said isolation means when the voltage being monitored rises above said preset upper level.

6. In a D/A converter formed on an IC chip wherein the converter includes an amplifier to be energized by a power-supply voltage with a nominal operating voltage level and having an output circuit producing an amplified signal for developing at an output terminal of the converter an analog output signal to be directed to a device responsive to such output signal; that improvement for preventing unstable output signal fluctuations during power-up or power-down of said supply voltage comprising:
   signal-isolation means comprising a transmission gate coupled between said output terminal and circuit common;
   means to receive a signal responsive to said power-supply voltage for indicating that the voltage is above a preset low level substantially below said nominal level and below a preset upper level above said preset low level but below said nominal level;
   said signal-receiving means being operable to control said signal-isolation means to prevent fluctuations in said output signal from reaching apparatus which might be adversely affected by such fluctuations.

7. A D/A converter as claimed in claim 6, including a second transmission gate between said amplifier output circuit and said converter output terminal, said second gate serving when operated to disconnect said amplifier output circuit from said converter output terminal.

8. In a D/A converter formed on an IC chip wherein the converter includes an amplifier to be energized by a power-supply voltage and having an output circuit producing an amplified signal for developing at an output terminal of the converter an analog output signal to be directed to a device responsive to such output signal; that improvement for preventing unstable output signal fluctuations upon power-up or power-down of said supply voltage comprising:

a voltage-monitoring device arranged to receive said power-supply voltage to sense its level;

signal-isolation means coupled to said output terminal;

said voltage-monitoring device being operable to activate said signal-isolation means upon detecting that the supply voltage is above a preset low level and below a preset upper level, thereby to prevent fluctuations in said output signal from reaching apparatus which might be adversely affected by such fluctuations;

said signal-isolation means comprising a transmission gate between said amplifier output circuit and said converter output terminal, said gate being arranged to be opened by said voltage-monitoring device when said power supply voltage is above said preset low level and below said preset upper level.

9. In a D/A converter formed on an IC chip wherein the converter includes an amplifier to be energized by a power-supply voltage and having an output circuit producing an amplified signal for developing at an output terminal of the converter an analog output signal to be directed to a device responsive to such output signal; that improvement for preventing unstable output signal fluctuations upon power-up or power-down of said supply voltage comprising:

a voltage-monitoring device arranged to receive said power-supply voltage to sense its level;

signal-isolation means coupled to said output terminal;

said voltage-monitoring device being operable to activate said signal-isolation means upon detecting that the supply voltage is above a preset low level and below a preset upper level, thereby to prevent fluctuations in said output signal from reaching apparatus which might be adversely affected by such fluctuations;

said signal-isolation means comprising a transmission gate between said converter output terminal and circuit common, said transmission gate being arranged to be closed by said voltage-monitoring device when the power supply voltage is above said preset low level and below said preset upper level.

10. In a D/A converter formed on an IC chip wherein the converter includes an amplifier to be energized by a power-supply voltage and having an output circuit producing an amplified signal for developing at an output terminal of the converter an analog output signal to be directed to a device responsive to such output signal; that improvement for preventing unstable output signal fluctuations upon power-up or power-down of said supply voltage comprising:

a voltage-monitoring device arranged to receive said power-supply voltage to sense its level;

signal-isolation means coupled to said output terminal;

said voltage-monitoring device being operable to activate said signal-isolation means upon detecting that the supply voltage is above a preset low level and below a preset upper level, thereby to prevent fluctuations in said output signal from reaching apparatus which might be adversely affected by such fluctuations;

said signal-isolation means comprising first and second transmission gates, said first gate being coupled between said amplifier output circuit and said converter output terminal, said second transmission gate being coupled between said converter output terminal and circuit ground.

11. In a D/A converter formed on an IC chip wherein the converter includes an amplifier to be energized by a power-supply voltage and having an output circuit producing an amplified signal for developing at an output terminal of the converter an analog output signal to be directed to a device responsive to such output signal; that improvement for preventing unstable output signal fluctuations upon power-up or power-down of said supply voltage comprising:

signal-isolation means comprising a transmission gate coupled between said output terminal and circuit common;

means to receive a signal responsive to said power-supply voltage for indicating that the voltage is above a preset low level and below a preset upper level;

said signal-receiving means being operable to control said signal-isolation means to prevent fluctuations in said output signal from reaching apparatus which might be adversely affected by such fluctuations; and a second transmission gate between said amplifier output circuit and said converter output terminal, said second gate serving when operated to disconnect said amplifier output circuit from said converter output terminal.

12. The method of preventing unstable output signal fluctuations during power-up of a D/A converter having an output amplifier with an output circuit energized by a power-supply voltage with a nominal operating level and producing an amplifier signal to be applied as an analog output signal to an output terminal; said method comprising the steps of:

monitoring said power-supply voltage during power-up to sense the voltage level;

determining when said voltage rises above a preset lower level substantially lower than said nominal operating level; and isolating said output circuit from said output terminal upon such determination.

13. The method of claim 12, wherein said isolating step includes interrupting the connection between said output circuitry and said output terminal.

14. The method of claim 12, wherein said isolating step includes short-circuiting said amplifier output terminal to a common potential.

15. The method of claim 14, wherein said common potential is that of ground.

16. The method of claim 12, including the step of determining when said voltage rises above a preset upper level above said lower level but lower than said nominal level; and removing said isolation of said output circuit upon reach said preset upper level.

* * * * *

UNITED STATES PATENT AND TRADEMARK OFFICE
CERTIFICATE OF CORRECTION

PATENT NO. : 5,319,371
DATED : June 7, 1994
INVENTOR(S) : Michael G. Curtin and Michael Byrne It is certified that error appears in the above-identified patent and that said Letters Patent is hereby corrected as shown below:

<u>Title page,</u>
Please amend Item No. [21] as follows:
-- Appl. No. 997,681 --

Signed and Sealed this

Fourth Day of June, 2002

Attest:

JAMES E. ROGAN
Attesting Officer      Director of the United States Patent and Trademark Office